United States Patent [19]

Van Rompuy

[11] Patent Number: 5,272,041
[45] Date of Patent: Dec. 21, 1993

[54] NEGATIVE TYPE LITHOGRAPHIC PRINTING PLATE

[75] Inventor: Ludo L. Van Rompuy, Destelbergen, Belgium

[73] Assignee: Agfa-Gevaert, N.V., Mortsel, Belgium

[21] Appl. No.: 774,190

[22] Filed: Oct. 10, 1991

[30] Foreign Application Priority Data

Oct. 19, 1990 [EP] European Pat. Off. ... EP90202789.5

[51] Int. Cl.$^5$ .............................................. G03C 8/32
[52] U.S. Cl. .................................. 430/264; 430/204; 430/248; 430/249; 430/230
[58] Field of Search ............... 430/204, 230, 264, 302, 430/309, 232, 244, 248, 249, 251

[56] References Cited

U.S. PATENT DOCUMENTS

| | | | |
|---|---|---|---|
| 3,020,155 | 2/1962 | Yackel et al. | 430/230 |
| 3,311,473 | 3/1967 | Foster et al. | 430/232 |
| 3,676,125 | 7/1972 | de Hues | 430/204 |
| 3,761,276 | 9/1973 | Evans | 430/217 |
| 3,854,949 | 12/1974 | Gilman et al. | 430/217 |
| 4,144,064 | 3/1979 | Vermeulen et al. | 430/204 |
| 4,309,499 | 1/1982 | Takagi et al. | 430/230 |
| 4,328,302 | 5/1982 | Nishimura et al. | 430/264 |
| 4,683,189 | 7/1987 | Idota et al. | 430/248 |
| 4,693,955 | 9/1987 | Torizuka et al. | 430/204 |
| 4,960,683 | 10/1990 | Okazaki et al. | 430/248 |

FOREIGN PATENT DOCUMENTS

| | | | |
|---|---|---|---|
| 1177933 | 9/1964 | Fed. Rep. of Germany | 430/204 |
| 2070796 | 9/1981 | United Kingdom | 430/302 |

*Primary Examiner*—Charles L. Bowers, Jr.
*Assistant Examiner*—Martin Angebranndt
*Attorney, Agent, or Firm*—Breiner & Breiner

[57] ABSTRACT

The present invention provides a method for obtaining a negative type lithographic printing plate comprising the steps of (i) image-wise exposing a diffusion transfer reversal imaging element comprising a direct positive silver halide emulsion that mainly forms an internal latent image and a layer containing physical development nuclei, (ii) fogging said image-wise exposed imaging element, (iii) developing said imaging element using a surface developer, (iv) transfering the undeveloped silver salts in the non-exposed areas to said layer containing physical development nuclei and (v) image-wise depositing said silver salts on said physical development nuclei in the presence of physical development restraining compound(s).

7 Claims, No Drawings

NEGATIVE TYPE LITHOGRAPHIC PRINTING PLATE

DESCRIPTION

The present invention relates to a negative type diffusion transfer imaging element and more particularly to a method for obtaining a negative type lithographic printing plate therewith.

The principles of the silver complex diffusion transfer reversal process, hereinafter called DTR-process, have been described e.g. in U.S. Pat. No. 2,352,014 and the book "Photographic Silver Halide Diffusion Processes" by André Rott and Edith Weyde — The Focal Press —London and New York, (1972).

According to the DTR process, a silver complex salt is image-wise transferred by diffusion from the image-wise exposed silver halide emulsion layer into the image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

The DTR process includes (a) a so-called "two-sheet" type where the silver halide emulsion layer and the image receiving layer are contained on separate supports and are brought into contact with each other at the time of diffusion transfer development to produce the silver image in the receiving sheet and (b) a so-called "mono-sheet type where both the emulsion layer and the layer containing the physical development nuclei are contained on the same support.

In the conventional negative-positive DTR-process a negative image is formed in the silver halide emulsion layer while a positive image is formed in the receiving layer.

At the exposed areas of the silver halide emulsion layer the silver halide is developed (chemical development) and thus cannot be dissolved anymore to diffuse to the receiving layer.

At the unexposed areas of the silver halide emulsion layer the silver halide is converted into a soluble silver complex salt and is transferred to the receiving layer, where it forms a silver image usually in the presence of physical development nuclei.

If a negative image of the original is to be formed in the receiving layer a positive image should be formed in the silver halide emulsion layer and the DTR process is then of the positive-negative type. The formation of negative images from the original are interesting where positive DTR-images are desired from negative originals. This requires the use of light-sensitive silver halide emulsion materials which upon exposure and development form direct positive images i.e. the formation of a silver image in the non-exposed areas.

It is further known to make lithographic printing plates by the DTR-process.

Printing plates made by the conventional DTR-process are of the positive type and thus the conventional DTR-process cannot be used to obtain a positive printing plate starting from negative originals.

Furthermore the conventional positive type DTR-process for direct plate making by lasers and scanners e.g. computer to plate applications which are recently widely employed, have the disadvantage of requiring a lot of exposure time since the non-image areas of the negative silver halide emulsion layer should be exposed in order to obtain in the image receiving layer image areas that are printing. Thus for computer to plate applications it is also desirable to have a silver halide emulsion layer forming a silver image in the non-exposed areas so that silver complexes from the exposed areas are transferred to form the oleophilic printing areas in the image receiving layer.

For the formation of a direct-positive image in the silver halide emulsion layer two main types of direct positive type silver halide emulsions are known.

One type is a silver halide emulsion that has been previously fogged. Such types of emulsion are commonly known as Herschel reversal emulsions and are described in e.g. U.S. Pat. No. 3,367,778. U.S. Pat. No. 3,733,199 discloses the use of such a type of emulsion for use in a diffusion transfer process. U.S. Pat. No. 4,149,889 and U.S. Pat. No. 4,175,965 describe the use of Herschel reversal emulsions for the production of a negative type lithographic printing plate. Such Herschel reversal emulsions however show a very low speed and are not suitable for computer-to-plate applications.

The second type of direct positive type emulsions are inner latent image type silver halide emulsions that have not been previously fogged. A direct positive image in the emulsion layer is obtained by effecting surface development after or while applying a fogging treatment subsequent to image-wise exposure. The fogging treatment may be performed by giving the whole surface an overall exposure, by chemical treatment using a foggant, or alternatively by use of a strong developer or heat treatment etc., but ordinarily the method by use of light or foggant is employed. The inner latent image type silver halide photographic emulsion refers to a silver halide photographic emulsion, having light-sensitive nuclei primarily internally of the silver halide grains which forms latent images internally of the grains by exposure. Examples of such a type of direct positive silver halide emulsions suitable for making a lithographic printing plate according to the silver salt diffusion transfer process are disclosed in e.g. EP-A- 365926, U.S. Pat. No. 3,761,266 and U.S. Pat. No. 4,309,499. This type of direct positive silver halide emulsion shows a much higher speed than the above first type.

The speed of such a direct positive type emulsion can be further increased when the emulsion contains large amounts of bromide. However processing of a DTR imaging element containing a direct positive type emulsion, not previously fogged, containing large amounts of bromide, with a transfer developer containing a solvent for silver halide, e.g. thiocyanate does not result in a silver mirror sufficiently strong for producing a lithographic printing plate of high printing endurance.

In U.S. Pat. No. 4,693,955 is disclosed an imaging element comprising a light-sensitive silver halide emulsion layer, a layer containing a non-light-sensitive silver salt, a layer containing physical development nuclei and a compound that upon reaction with the oxidized form of a developing agent releases a silver complexing agent that image-wise dissolves the non-light-sensitive silver salts to image-wise deposit the non-light-sensitive silver salt in the layer containing the physical development nuclei. The method has the disadvantage that relative large amounts of the compound that releases the silver complexing agent have to be used to obtain a sufficient strong silver mirror. Furthermore the synthesis of such a compound is complex making such a compound rather costly.

It is an object of the present invention to provide a method for obtaining a lithographic printing plate of high printing endurance using a DTR imaging element comprising a direct positive silver halide emulsion of high speed.

Further objects of the present invention will become clear from the description hereinafter.

According to the invention a method is provided to obtain a lithographic printing plate comprising the following steps:

image-wise exposing an imaging element comprising on a support (i) a direct positive silver halide emulsion that mainly forms an internal latent image and (ii) a layer containing physical development nuclei fogging said image-wise exposed imaging element using a fogging agent and/or overall exposing said imaging element developing the thus obtained imaging element using a developer that only develops a surface latent image dissolving non-developed silver salts in the presence of a silver complexing agent to obtain silver complexes allowing said silver complexes to image-wise diffuse to said layer containing physical development nuclei and depositing said silver complexes on said physical development nuclei in the presence of (a) physical development restraining compound(s).

Suitable physical development restraining compounds for use according to the present invention are tetrazoles, oxazoles, thiazoles, pyrimidines, imidazoles, tetrazaindenes, pyrazoles, pyrazolone, imadazole etc. and mixtures thereof. Preferred physical development restraining compounds correspond to general formula (I) or (II):

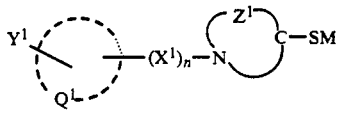

wherein M represents a metal or hydrogen, $Z^1$ represents a group of atoms to complete a heterocyclic ring system together with the atoms N and C including fused heterocyclic ring systems, $X^1$ represents an organic divalent group e.g. NR with R being a hydrogen or alkyl group, $Q^1$ represents a group of atoms necessary to complete an aromatic ring e.g. a phenylene group, $Y^1$ represents a hydrophilic group e.g. an organic acid or salt thereof e.g. a carboxylate, a sulphonate, thiosulphonate, and n may be 0 or 1.

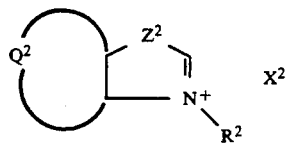

wherein $R^1$ and $R^2$ which may be the same or different represent hydrogen or an alkyl group, $R^1$ and $R^2$ may also together represent the necessary atoms to a ring with the N and C atoms to which they are attached, $Q^2$ represents a group of atoms necessary to complete a fused on aromatic ring, $Z^2$ represents O or S and $X^2$ represents an anion. Examples of compounds of general formula I are:

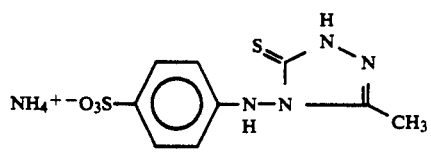

Examples of compounds corresponding to general formula (II) are:

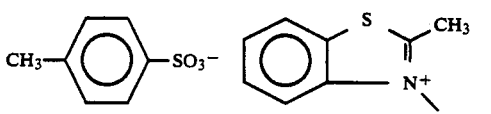

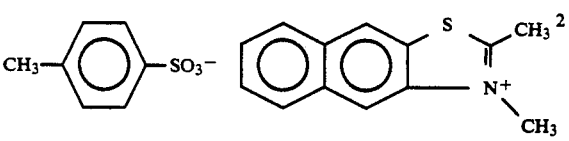

Said physical development restraining compound(s) may be present in a processing solution or may be comprised in a layer contained on said imaging element. Preferably said physical development restraining compound(s) is (are) present in the transfer developing solution.

The direct positive silver halide emulsion used in accordance with the present invention is of the type that forms an internal latent image. An internal latent image-type silver halide emulsion is an emulsion, the maximum density of which obtained when developing it with an "internal type" developing solution exceeds the maximum density that is achievable when developing it with a "surface-type" developing solution. The internal latent image-type emulsions that are suited for use in accordance with the present invention yield a maximum density that, when these emulsions have been coated on a transparent support and are exposed to light for a fixed time of from 1/100 to 1 s and then developed for 3 min at 20° C. with the internal-type Developing Solution A as described hereinafter, is higher by at least 5 times than the maximum density obtained when the same silver halide emulsion exposed as described above is developed for 4 min at 20° C. with the surface-type Developing Solution B as described hereinafter.

| Internal-type Developing Solution A | |
|---|---|
| hydroquinone | 15 g |
| monomethyl-p-aminophenol sulphate | 15 g |
| anhydrous sodium sulphite | 50 g |
| potassium bromide | 10 g |
| sodium hydroxide | 25 g |
| crystalline sodium thiosulphate | 20 g |

| -continued | |
|---|---|
| Water to make | 1 l |
| Surface-type Developing Solution B | |
| p-hydroxyphenylglycine | 10 g |
| crystalline sodium carbonate | 100 g |
| water to make | 1 l |

Internal latent image-type silver halide emulsions that can be used in accordance with the present invention have been described in e.g. U.S. Pat. Nos. 2,592,250, 3,206,313, 3,271,157, 3,447,927, 3,511,662, 3,737,313, 3,761,276, GB-A No. 1,027,146, and JA Patent Publication No. 34,213/77. However, the silver halide emulsions used in the present invention are not limited to the silver halide emulsions described in these documents.

Suitable direct positive silver halide emulsions which mainly form an internally latent image are generally emulsions that have not been prefogged and have not been chemically ripened or only slightly, since the ability to form a surface latent image increases with the degree of chemical ripening. Silver chlorobromide emulsions comprising at least 20 mol % of silver bromide and pure silver bromide are particularly suited for the present invention. Silver chlorobromide emulsions or silver bromide emulsions containing up to 5 mol % silver iodide are also suitable for use with the present invention. Said direct positive silver halide emulsions may be so called conversion type emulsions or core-shell emulsions.

The direct positive silver halide emulsion may be prepared by techniques conventional for photographic emulsion preparation as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966). The photographic silver halide emulsions used in the method of the present invention can be prepared by mixing the halide and silver solutions in partially or fully controlled conditions of temperature, concentrations, sequence of addition, and rates of addition. The silver halide can be precipitated according to the single-jet method, the double-jet method etc.

A preparation method which has proved to be particularly suitable is the so called conversion method. According to this method a more soluble silver halide is converted in a less soluble silver halide, e.g., a silver chloride emulsion is converted in the presence of water soluble bromide and possibly iodide, the amounts of which are selected with regard to the final composition, into a silver chlorobromide or silver bromide emulsion, which may also include a small amount of iodide. This conversion is preferably carried out very slowly in several consective steps, i.e. by converting a part of the more soluble silver halide at a time. A more detailed description of the preparation of such direct positive silver halide emulsion can be found in the examples of GB-PS-1195837. Another technique by which such direct positive silver halide emulsions may be prepared is described in GB-PS-1011062.

The binder of the direct positive silver halide emulsion layer preferably is gelatin. But instead of gelatin, use can be made of one or more other natural and/or synthetic hydrophilic colloids e.g. albumin, casein, zein, polyvinyl alcohol, alginic acids or salts thereof, cellulose derivatives e.g. carboxymethyl cellulose, modified gelatin, etc.

Suitable physical development nuclei for use with the present invention are e.g. colloidal silver, heavy metal sulphides e.g. silver sulphide, nickel sulphide, palladium sulphide, cobalt sulphide, zinc sulphide, silver nickel sulphide etc. The layer of physical development nuclei may contain a hydrophilic binder but preferably does not contain a binder. When a hydrophilic binder is used, those mentioned as binders for the direct positive silver halide emulsions can be used.

The support of the imaging element used in accordance with the present invention can be any of the support materials customarily employed in the art. They include metal supports e.g. aluminum or zinc, paper coated on one or both sides with an Alpha-olefin polymer, e.g. polyethylene, glass or film, e.g. cellulose acetate film, polyvinyl acetal film, polystyrene film, polyethylene terephthalate film etc. Polyethylene terephthalate film coated with a subbing layer to improve the adhesion of the thereon deposited layers of the invention is preferred.

The support may further be coated with a backing layer containing pulverized particles, e.g. inorganic particles e.g. silica or organic particles e.g. particles of polymethyl methacrylate, having an average grain size from 0.1 to 10 μm to prevent the formation of poor quality image arising from rubbing flaws and static electricity.

The imaging element may contain in the light-sensitive silver halide emulsion layer and/or the layer containing the physical development nuclei and/or in one or more layers in water-permeable relationship therewith any kinds of compounds customarily used for carrying out the DTR-process. Such layers may comprise e.g. one or more developing agents, coating aids, stabilizing agents, plasticizers, development-influencing agents e.g. polyoxyalkylene compounds, onium compounds, and thioether compounds as described in the U.S. Pat. Nos. 2,938,792; 3,021,215; 3,038,805; 3,046,134; 4,013,471; 4,072,523; 4,072,526; 4,292,400 and in the DE Pat. No. 1,124,354, hardeners, spectral sensitizing agents, chemical sensitizing agents, etc.

In a preferred embodiment of the present invention the image-wise exposed DTR imaging element is developed with a surface developer and a fogging treatment is applied before or during surface development. A surface developer here means that the developer used mainly develops a surface latent image and does not effect the internal latent image. Examples of developing agents contained in a surface developer are e.g. hydroquinone or p-hydroxyphenylglycine. The developing agents may also be contained in said imaging element. When the surface developing agent(s) are contained in the imaging element they may be contained in the silver halide emulsion layer, the layer containing physical development nuclei or in a separate layer in water permeable relation with one or both of these layers.

Fogging treatment may be done by means of an overall exposure of said image-wise exposed imaging element but is preferably carried out using a fogging agent.

The fogging agent may be contained in the surface developer or may alternatively be contained in the imaging element. Fogging agents suitable or use with the present invention are compounds capable of preferentially fogging during development processing or a prebath processing the surface of the silver halide grains that have no internal latent image thus making such grains developable with a surface type developer and, on the other hand, that do not form surface development centers in silver halide grains already having an internal latent image. Suitable fogging agents are e.g. boron hydride compounds, tin compounds, hydrazine derivatives as described in U.S. Pat. No. 2,588,982 and U.S. Pat. No. 2,568,785 e.g. hydrazine dihydrochloride, p-tolylhydrazine hydrochloride, p-nitrophenylhydrazine hydrochloride, phenylhydrazine hydrochloride, diamino biuret etc., the hydrazide derivatives described in U.S. Pat. No. 3,227,552 e.g. 1-formyl-2-phenylhydrazide, 1-acetyl-2-phenylhydrazide, 1-phenylsulfonyl-2-phenylhydrazide etc., the hydrazones as described in U.S. Pat. No. 3,227,552 the hydrazone quaternary salts described in U.S. Pat. No. 3,615,615 e.g. 3-(2-formylethyl)-2-methylbenzothiazolium bromide, the hydrazines containing a thiourea group described in U.S. Pat. No. 4,030,925 and U.S. Pat. No. 4,031,127 e.g. 1-[4-(2-formylhydrazino)phenyl]-3-methylthiourea,1-[4-(2-formylhydrazino)phenyl]-2-phenylthiourea, 1-[3-N-(4-formylhydrazino-phenyl)carbamoylphenyl]-2-phenylthiourea etc., etc., and mixtures thereof.

The imaging element is processed subsequently to the above described development in the presence of a physical development restraining compound and a silver complexing agent in a transfer developing solution. The physical development restraining compound corresponds e.g. to the general formula I or II and is preferably compound 1 shown above. The physical development restraining compound may be contained in the imaging element but is preferably contained in the transfer developing liquid. Suitable complexing agents for silver are 2-mercaptobenzoic acid derivatives and cyclic imides as described in U.S. Pat. No. 4,297,429 and U.S. Pat. No. 4,297,430 which are included herein by reference, thiosulfates, thiocyanates, thioethers, thiazolines etc, or mixtures thereof. Of the foregoing, thiocyanates are preferred for use with the present invention.

The silver complexing agent(s) may be contained in the imaging element or may also be present in said transfer developing liquid. When the silver complexing agent(s) are contained in the imaging element they may be contained in the silver halide emulsion layer, the layer containing physical development nuclei or in a separate layer in water permeable relation with one or both of these layers.

The transfer developing liquid further contains (a) developing agent(s). Suitable developing agents are e.g. hydroquinone-type and 1-phenyl-3-pyrazolidone-type developing agents as well as p-monomethylaminophenol. It is preferred to use combinations of these developing agents as is well known in the art.

The developing agent(s) may alternatively be present in the imaging element. When the developing agent(s) are contained in the imaging element they may be contained in the silver halide emulsion layer, the layer containing physical development nuclei or in a separate layer in water permeable relation with one or both of these layers.

The above described processing in two steps i.e. using a surface developer and transfer developer may also be accomplished in one step thus merging said surface developer and transfer developer in one processing solution.

According to a pratical embodiment of the present invention an imaging element comprising on a paper or resin support in the order given (i) a direct positive silver halide emulsion that mainly forms an internal latent image and (ii) a layer of physical development nuclei is image-wise exposed and subsequently developed as described above. The thus obtained developed plate is then preferably rinsed with water to clean the silver image formed on the surface of the plate and/or may be treated with a neutralization liquid to neutralize the alkaline plate after treatment with the developing liquid(s).

According to an alternative embodiment of the present invention an imaging element comprising on an aluminium support in the order given (i) a layer of physical development nuclei and (ii) a direct positive silver halide emulsion that mainly forms an internal latent image is image-wise exposed and subsequently developed as described above. The thus obtained element is subsequently rinsed with water to remove the emulsion layer and any optional layers to expose the silver image formed in the physical development nuclei layer during development. A lithographic printing plate is thus obtained that can be used on an offset press operating with a dampening solution. According to a variation of this embodiment an intermediate layer comprising a hydrophilic non-proteinic film forming polymer and/or polymer beads may be provided between the physical development nuclei layer and silver halide emulsion layer to facilate the removal of the emulsion layer. Such type of intermediate layer is disclosed in EP-A-90202900.8 and EP-A-410500.

Normally in lithographic printing greasy inks are employed. So, to obtain good prints it is necessary that the difference in oleophilic and hydrophilic (oleophobic) properties of the image and background surface is sufficiently distinct so that when water and ink are applied during the printing process, the image will accept sufficient ink leaving the background clean.

Suitable methods to enhance the differentiation in ink acceptance between the hydrophobic silver image parts and the hydrophilic non-image parts are as follows. Use can be made of so-called hydrophobizing agents to improve the ink acceptance of the silver image parts and which can be present, depending on the case, in one of the normal processing solutions of the DTR process, or in a separate solution, a so-called lithographic fixer. For example, U.S. Pat. No. 3,776,728 describes i.a. developer solutions which contain a heterocyclic mercapto-compound, e.g. a 2-mercapto-1,3,4-oxadiazole derivative, as hydrophobizing agent. U.S. Pat. No. 4,563,410 describes hydrophobizing liquids containing one or more mercaptotriazole or mercaptotetrazole derivatives or mixtures thereof.

Another method of enhancing the hydrophobic character of the silver image that can be used in accordance with the present invention consists in maximizing the ratio of the amount of development nuclei to the amount of hydrophilic binder, e.g. gelatin, in the development nuclei containing surface layer where the DTR-image is formed. For example U.S. Pat. No. 3,728,114 describes a direct positive sheet suitable for producing an offset printing plate which contains in its surface layer at most 30% of a high molecular weight compound, e.g. gelatin, relative to the weight of the nuclei.

The following examples illustrate the present invention. All percentages are by weight unless otherwise stated.

EXAMPLE 1

A gelatino silver chlorobromoiodide emulsion that mainly forms a internal latent image is prepared by conversion of a silver chlorobromide emulsion containing 19 mol % of silver bromide by very slowly adding to 1 kg of said emulsion whilst stirring 90 ml of a 35% aqueous potassium bromide solution in 15 min. Said emulsion is physically ripened for 1 hour at 40° C. and 100 ml of a solution containing 34% of potassium bromide and 1% potassium iodide is subsequently added. Said emulsion is subsequently cooled and washed. By heating the washed emulsion, a liquid silver chlorobromoiodide emulsion, is obtained containing 96 mol % of bromide and 0.5 mol % of iodide.

The thus prepared silver chlorobromoiodide emulsion is coated in an amount equivalent to 3.18 g/m² of silver nitrate onto a polyethyleneterephthalate film support (coated with a hydrophilic adhesion layer).

The emulsion layer is overcoated with a layer of physical development nuclei being palladium sulphide nuclei.

The thus obtained imaging element was image-wise exposed during 1 μs using a Xenon flash. The distance between said imaging element and the Xenon flash was 58 cm. The intensity of the Xenon flash was 13.8 J/cm² which was reduced using a grey filter with a density of 1.5.

The thus obtained image-wise exposed imaging element was processed for 20 s in a surface developer of the following composition:

| | |
|---|---|
| N-methyl-p-hydroxy-aniline | 30 g |
| sodium sulphite | 110 g |
| sodium hydroxide | 23 g |
| N-methylaminoethanol | 40 ml |
| EDTA | 1 g |
| sodium carbonate | 40 g |
| hydroquinone | 24 g |
| sodium bromide | 5 g |
| oxalic acid | 2 g |
| 1-[[4-(2-formylhydrazino)phenyl]-aminocarbonylmethyl]-3-methyl-2-thioxo-4-imidazolidone | 0.26 g |
| water to make | 1000 ml |

After rinsing, said imaging element was processed for 15 s in a transfer developing solution of the following solution:

| | |
|---|---|
| sodium hydroxide | 30 g |
| sodium sulphite | 33 g |
| EDTA | 1 g |
| potassium thiocyanate | 80 g |
| 5-n-heptyl-2-mercapto-1,3,4-oxadiazol | 0.15 g |
| hydroquinone | 13 g |
| 1-phenyl-4,4-dimethyl-3-pyrazolidone | 4.7 g |
| compound 1 | 0.7 g |
| water to make | 1000 ml |

After rinsing said imaging element a lithographic printing plate was obtained. Said printing plate was wiped with a starter solution G540b commercially available from AGFA-GEVAERT N.V. and mounted on an offset press. 10000 copies of good quality could be printed using a conventional fountain solution and an oleophilic lithographic ink.

I claim:

1. A method for producing a lithographic printing plate comprising the steps of:
    image-wise exposing an imaging element comprising on a support (i) a direct positive silver halide emulsion that mainly forms an internal latent image and (ii) a layer containing physical development nuclei
    fogging said image-wise exposed imaging element using a fogging agent and/or overall exposing said imaging element
    developing the thus obtained imaging element with a developer that only develops a surface latent image
    dissolving non-developed silver salts in the presence of a silver complexing agent to obtain silver complexes
    allowing said silver complexes to image-wise diffuse to said layer containing physical development nuclei
    and depositing said silver complexes on said physical development nuclei in the presence of (a) physical development restraining compound(s).

2. A method according to claim 1 wherein said physical development restraining compound corresponds to general formula I or II:

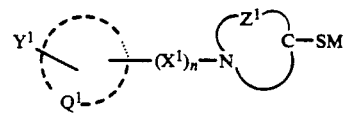

wherein M represents a metal or hydrogen, $Z^1$ represents a group of atoms to complete a heterocyclic ring, $X^1$ represents an organic divalent group, $Q^1$ represents a group of atoms to complete an aromatic ring, $Y^1$ represents a hydrophilic group and n may be 0 or 1.

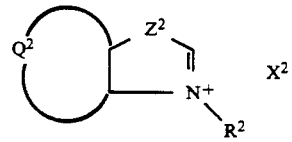

wherein each of $R^1$ and $R^2$ which may be the same or different represents hydrogen or an alkyl group, $R^1$ and $R^2$ may also together represent the necessary atoms to a ring with the N and C atoms to which they are attached. $Q^2$ represents a group of atoms necessary to complete a fused on aromatic ring, $Z^2$ represents O or S and $X^2$ represents an anion.

3. A method according to claim 1 wherein said physical development restraining compound corresponds to one of the following compounds:

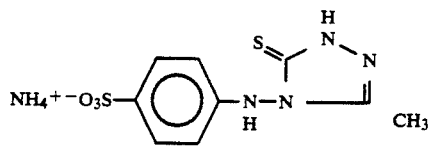

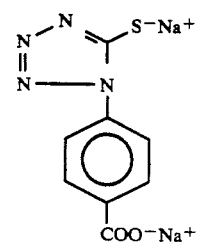

-continued

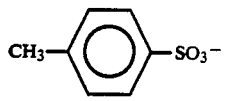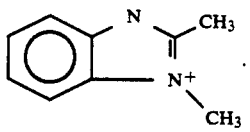

4. A method according to claim 1 wherein said direct positive type emulsion contains at least 20 mol % of silver bromide.

5. A method according to claim 1 wherein said fogging is carried out by means of a fogging agent present in a processing liquid or in one or more layers comprised on said imaging element.

6. A method according to claim 5 wherein said fogging agent is a hydrazine derivative.

7. A method according to claim 1 wherein said silver complexing agent is a thiocyanate.

* * * * *